United States Patent
Peralta et al.

(10) Patent No.: US 11,366,156 B2
(45) Date of Patent: Jun. 21, 2022

(54) CRACK DETECTION INTEGRITY CHECK

(71) Applicant: STMicroelectronics Pte Ltd, Singapore (SG)

(72) Inventors: Pedro Jr Santos Peralta, Silang (PH); David Gani, Singapore (SG)

(73) Assignee: STMicroelectronics Pte Ltd, Singapore (SG)

(*) Notice: Subject to any disclaimer, the term of this patent is extended or adjusted under 35 U.S.C. 154(b) by 197 days.

(21) Appl. No.: 16/746,201

(22) Filed: Jan. 17, 2020

(65) Prior Publication Data

US 2020/0241068 A1   Jul. 30, 2020

Related U.S. Application Data

(60) Provisional application No. 62/796,153, filed on Jan. 24, 2019.

(51) Int. Cl.
*G01R 31/28* (2006.01)
*H01L 21/66* (2006.01)
*G01R 31/3185* (2006.01)
*G01R 31/26* (2020.01)

(52) U.S. Cl.
CPC ..... *G01R 31/2831* (2013.01); *G01R 31/2601* (2013.01); *G01R 31/2812* (2013.01); *G01R 31/318511* (2013.01); *H01L 22/20* (2013.01)

(58) Field of Classification Search
CPC ............ G01R 31/2601; G01R 31/2812; G01R 31/318511
See application file for complete search history.

(56) References Cited

U.S. PATENT DOCUMENTS

| | | | |
|---|---|---|---|
| 6,505,397 B1 | 1/2003 | Mimata et al. | |
| 7,028,396 B2 | 4/2006 | Hassan | |
| 7,402,995 B2 | 7/2008 | Adachi et al. | |
| 8,723,542 B2 | 5/2014 | Lin | |
| 9,250,292 B2 | 2/2016 | Chen | |
| 9,250,293 B2 | 2/2016 | Xue et al. | |
| 9,519,024 B2 | 12/2016 | Chen | |
| 9,557,376 B2 | 1/2017 | Dennison et al. | |
| 9,664,706 B2 | 5/2017 | Choi et al. | |
| 10,444,270 B2 * | 10/2019 | Yun | G01R 1/07364 |
| 2003/0237061 A1 * | 12/2003 | Miller | G01R 31/31718 438/18 |
| 2006/0097742 A1 * | 5/2006 | McGinnis | G01R 31/2886 324/750.19 |

(Continued)

*Primary Examiner* — Alvaro E Fortich
(74) *Attorney, Agent, or Firm* — Crowe & Dunlevy

(57) ABSTRACT

A method of testing integrated circuit die for presence of a crack includes performing back end integrated circuit fabrication processes on a wafer having a plurality of integrated circuit die, the back end fabrication including an assembly process. The assembly process includes a) lowering a tip of a first manipulator arm to contact a given die such that pogo pins extending from the tip make electrical contact with conductive areas on the given die so that the pogo pins are electrically connected to a crack detector on the given die, b) picking up the given die using the first manipulator arm, and c) performing a conductivity test on the crack detector using the pogo pins to determine presence of a crack in the given die that extends from a periphery of the die, through a die seal ring of the die, and into an integrated circuit region of the die.

10 Claims, 5 Drawing Sheets

(56) References Cited

U.S. PATENT DOCUMENTS

| | | | |
|---|---|---|---|
| 2009/0227048 A1 | 9/2009 | Fang et al. | |
| 2013/0234745 A1* | 9/2013 | Yamada | G01R 1/44 324/750.11 |
| 2013/0293252 A1* | 11/2013 | Chen | G01R 31/2896 324/750.16 |
| 2017/0131346 A1* | 5/2017 | Roberts, Jr. | G01R 31/2889 |
| 2018/0374736 A1* | 12/2018 | Kumar | H01L 21/6833 |

* cited by examiner

CRACK DETECTION INTEGRITY CHECK

RELATED APPLICATION

This application claims priority to United States Provisional Application for Patent No. 62/796,153, filed on Jan. 24, 2019, the contents of which are incorporated by reference in their entirety.

TECHNICAL FIELD

This disclosure is related to the field of integrated circuit manufacture and, in particular, to a manufacturing process flow in which crack detection is performed during die flip or die handoff.

BACKGROUND

During integrated circuit manufacturing, it may be desired to protect individual die on a wafer from mechanical cracks, which may lead to failures of the die.

A sample integrated circuit die 40 is shown in FIG. 1. A die seal ring 42 is positioned between a periphery 41 of the integrated circuit die 40 and an integrated circuit region 44 of the integrated circuit die 40. The purpose of the die seal ring 42 is to help avoid propagation of cracks from the periphery 41 to the integrated circuit region 44, which could cause failure of the circuits in the integrated circuit region. A crack that forms in the periphery 41 but does not propagate past the die seal ring 42 does not cause failure of the integrated circuit region. In addition to blocking cracks, the die seal ring 42 may serve to block environmental ingress.

While the die seal ring 42 is indeed somewhat effective in avoiding the propagation of cracks from the periphery 41 into the integrated circuit region 44, in some situations it may not avoid all cracks, and thus, cracks may still propagate through to the integrated circuit region 44.

Therefore, in addition to using the die seal ring 42 to attempt to avoid propagation of cracks into the integrated circuit region 44, it is desired to know whether a crack has in fact propagated into the integrated circuit region 44. For this, a crack detector 43 may be used. A crack detector 43 is comprised of a conductive via chain arranged about an inner circumference of the die seal ring 42. As can be seen, a first pad and/or conductive bump 45 is electrically connected to a first portion of the crack detector 43, and a second pad and/or conductive bump 46 is electrically connected to a second portion of the crack detector 43. By testing electrical continuity between the first and second pads 45 and 46, presence of a crack can be detected.

While the use of the crack detector 43 in combination with the die seal ring 42 provides for effective detection of failed die and protection from cracks adequate to increase manufacturing yield, existing crack detection utilizes specialized testing fixtures and processes, which adds to manufacturing complexity and reduces manufacturing throughput. As such, additional development into the area of crack detection is needed.

SUMMARY

Disclosed herein is a method of testing an integrated circuit die for presence of a crack. The method includes performing back end integrated circuit fabrication processes on a wafer having a plurality of integrated circuit die, with the back end integrated circuit fabrication process including an assembly process. The assembly process includes steps of: a) lowering a tip of a first manipulator arm to contact a given integrated circuit die of the plurality of integrated circuit die of the wafer such that pogo pins extending from the tip make electrical contact with conductive areas on the given integrated circuit die so that the pogo pins are electrically connected to a crack detector on the given integrated circuit die, b) performing a conductivity test on the crack detector using the pogo pins, c) if the conductivity test indicates a lack of presence of a crack in the given integrated circuit die, picking up the given integrated circuit die using the first manipulator arm, and d) if the conductivity test indicates presence of a crack in the given integrated circuit die, raising the tip of the first manipulator arm without picking up the given integrated circuit die, moving the first manipulator arm to a next given integrated circuit die, and repeating steps a), b), c) and d) on the next given integrated circuit die.

The presence of the crack in the given integrated circuit die indicates that the crack extends from a periphery of the given integrated circuit die, through a die seal ring of the given integrated circuit die, and into an integrated circuit region of the given integrated circuit die.

The first manipulator arm may have the following structure, and therefore may include a manipulator body having a cavity extending therethrough, with a manipulator tip associated with the manipulator body and having a first cavity extending therethrough in fluid communication with the cavity of the manipulator body such that suction applied to a distal end of the cavity of the manipulator body results in suction into a distal end of the first cavity. The manipulator tip also has a second cavity extending therethrough and a third cavity extending therethrough. A tester jig is between the manipulator body and manipulator tip, the tester jig including a first electrically conductive probe extending through the second cavity to protrude from a distal end of the manipulator tip and a second electrically conductive probe extending through the third cavity to protrude from the distal end of the manipulator tip.

The manipulator body may have a narrowed male end adjacent the manipulator tip, and the manipulator tip may have an enlarged female end receiving the narrowed male end of the manipulator body.

The manipulator arm may also include a first conductor directly electrically connected to the first electrically conductive probe, and extending through the manipulator tip and the manipulator body to protrude from an exterior surface of the manipulator body. The manipulator arm may also include a second conductor directly electrically connected to the second electrically conductive probe, and extending through the manipulator tip and the manipulator body to produce from the exterior surface of the manipulator body.

A test interface may be coupled to the first and second conductors, and the test interface may be configured to perform a continuity test to determine whether a high electrical conductivity is present between the first and second electrically conductive probes or whether a low electrical conductivity is present between the first and second electrically conductive probes. High electrical conductivity indicates a lack of a crack in an integrated circuit region of an integrated circuit die being tested by the manipulator device, while low electrical conductivity indicates a crack in the integrated circuit region of the integrated circuit die being tested by the manipulator device.

A suction source may be in fluid communication with the cavity of the manipulator body so as to provide suction upward into the distal end of the first cavity of the manipulator tip.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2A:
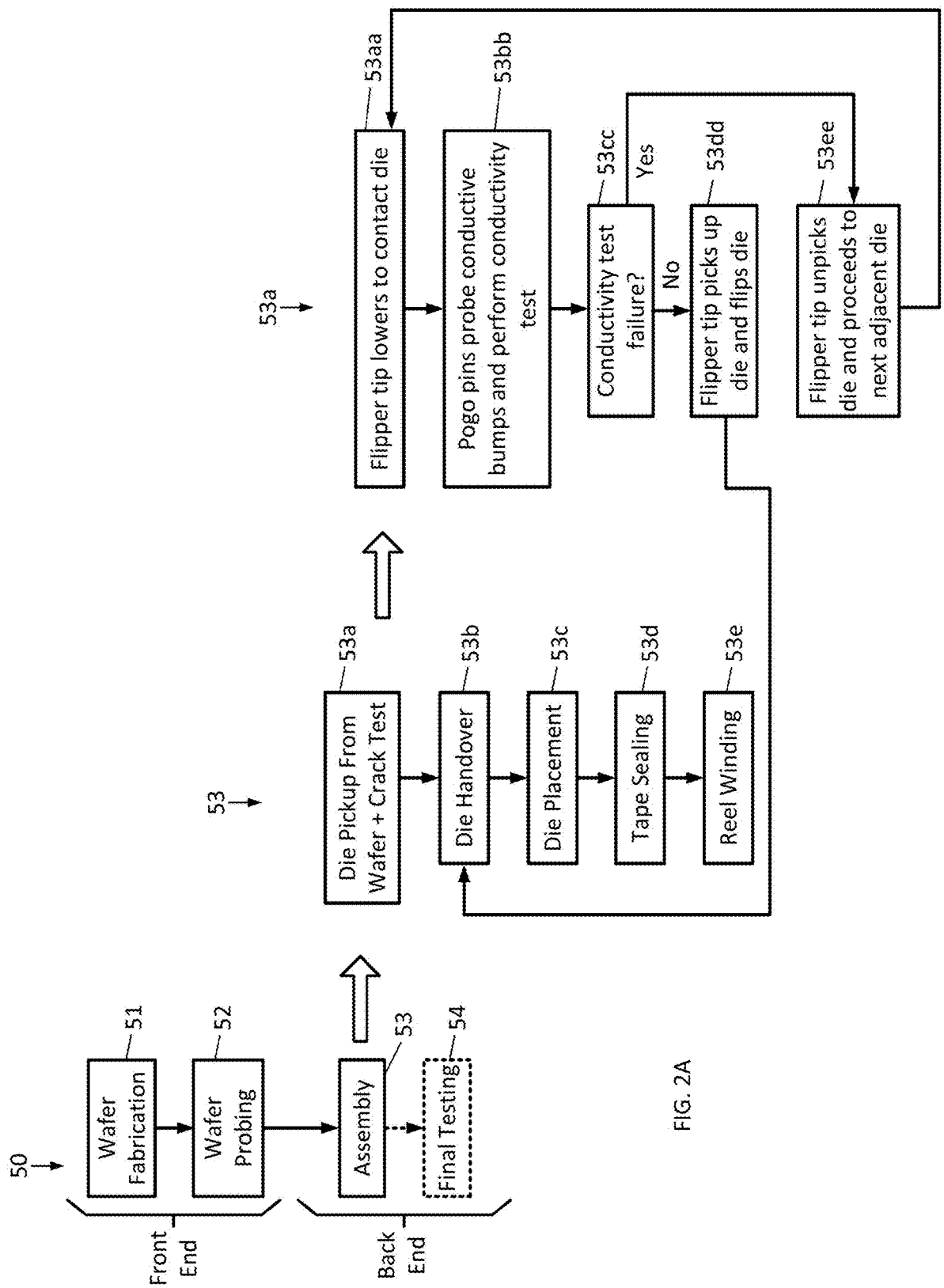
FIG. 2A is a flowchart of a first method for producing integrated circuit die, including crack detection, in accordance with this disclosure.

With reference to the flowchart 50 of FIG. 2A, a first process flow for integrated circuit die manufacturing is described. Integrated circuit die manufacturing can be divided into two broad steps, namely "front end" and "back end" manufacturing.

Front end manufacturing includes steps of wafer fabrication 51 and wafer probing 52. During wafer fabrication 51, a plurality of integrated circuit die are formed on a wafer in a multi-step process. Each such step adds a new layer to the wafer or modifies an existing layer. Collectively, these layers form the elements of individual integrated circuits within each integrated circuit die. Since this disclosure does not concern the wafer fabrication 51 step itself, further details need not be given, suffice to say that, as stated, the end result is a plurality of integrated circuit die formed on a wafer. Note that at this point, the integrated circuit die are not yet packaged and sealed.

After wafer fabrication 51, wafer probing 52 is performed. This verifies the functionality of the integrated circuit die by performing numerous electrical tests using microprobes. In general, process parametric testing is performed first, and then a full wafer probing test and sort (often referred to collectively as "wafer sort") is performed. Process parametric testing is typically performed on a subset of the integrated circuit die present on the wafer and serves to check the integrity of the wafer fabrication process itself, while the full wafer probing test verifies the functionality of the finished (but not yet packaged) integrated circuit die themselves and is therefore performed on each integrated circuit die present on the wafer.

A crack detection test is performed as a penultimate or final step of the wafer probing test. Referring back to FIG. 1, as explained above, a crack detection test involves the performance of an electrical continuity test on a crack detector via chain 43 bordering the integrated circuit region 44 of an integrated circuit die 40. If no crack has formed in the periphery 41 of the integrated circuit die 40, then when the conductive bumps 45 and 46 are probed and the electrical continuity test is performed, the result is a high electrical conductivity (i.e., such as can be considered to be a closed circuit through which electricity flows) between the conductive bumps 45 and 46. If a crack has formed in the periphery 41 of the integrated circuit die 40, but has not propagated past the die seal ring 42, then when the conductive bumps 45 and 46 are probed and the electrical continuity test is performed, the result is likewise a high electrical conductivity between the conductive bumps 45 and 46. However, if a crack has formed in the periphery 41 of the integrated circuit die 40, and has propagated past the die seal ring 42 into the integrated circuit region 44, then when the conductive bumps 45 and 46 are probed and the electrical continuity test is performed, the result is a low electrical conductivity (i.e., such as can be considered to be an open circuit through which electricity does not flow).

Integrated circuit die found to be bad during the wafer probing tests (including the crack detection test) are marked (for example, with a black dot) so they can be separated from the integrated circuit die found to be working properly during the wafer probing test. Separating the bad integrated circuit die from the functional integrated circuit die is referred to as wafer sorting.

Once the wafer probing 52 tests are completed, the front end manufacturing is complete. Therefore, the back end manufacturing now begins. Back end manufacturing can be divided into steps of assembly 53 and an optional step of final testing 54 performed by the end customer.

Figure 3:
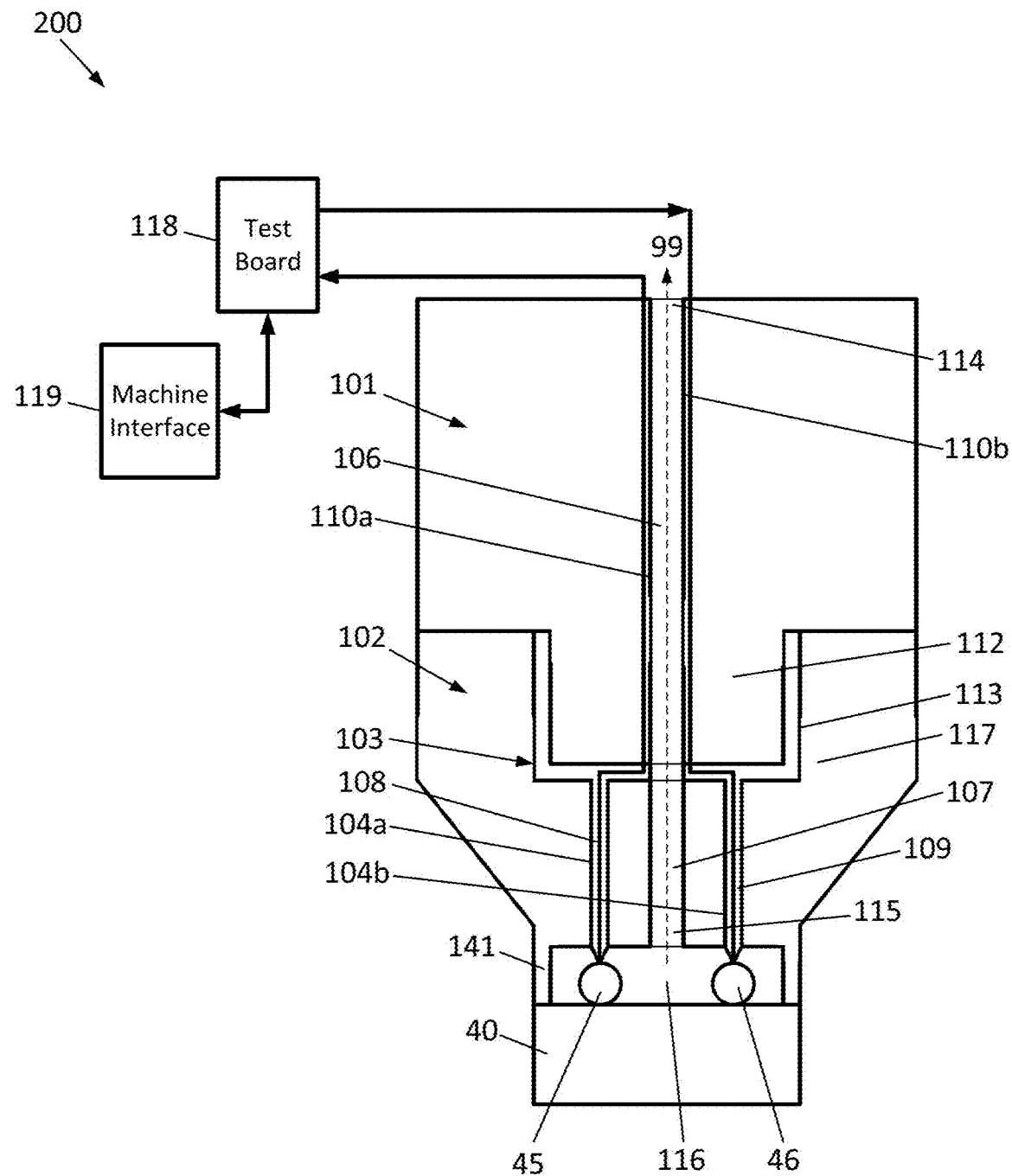
FIG. 3 is a cutaway view of a manipulator arm for use with the methods of FIG. 2A-2B.

Back end manufacturing will now be described, but first, a specialized manipulator arm 200 will be described with reference to FIG. 3. The manipulator arm 200 includes a manipulator body 101 (which can also be referred to as a manipulator shank) having a central cavity 106 running therethrough. The manipulator body 101 has a reduced diameter male end 112.

A manipulator tip 102 (which can also be referred to as a collet) has a female portion 117 sized to mate with the male end 112 of the manipulator body 101. The manipulator tip 102 has a central cavity 107 running therethrough that is in fluid communication with the central cavity 106 of the manipulator body 101 so that when suction 99 is applied to a distal end 114 of the manipulator body 101, the suction 99 results in suction into a distal end 115 of the manipulator tip 102. The manipulator tip 102 has two cavities 108 and 109 running therethrough that are offset from the central cavity 107. A wall 141 extends outward from the distal end 115 of the manipulator tip 102 and surrounds a perimeter of the distal end 115 to form a cavity 116 dimensioned so as to be smaller than the integrated circuit die 40. Suction 99 results in the integrated circuit die 40 being held by the manipulator tip 102.

A tester jig 103 is dimensioned to fit between the manipulator body 101 and manipulator tip 102. In particular, the tester jig 103 includes a cupped wall 113 that encircles the male end 112 of the manipulator body 101, but does not occlude or block any portion of the central cavity 106. The tester jig 103 includes electrically conductive probes 104a and 104b (which can be referred to as "pogo pins") that respectively extend through the cavities 108 and 109 of the manipulator tip 102 and protrude from the distal end 115 of the manipulator tip 102 sufficiently to make direct physical and electrical contact with conductive bumps 45 and 46 on the integrated circuit die 40.

Conductors 110a and 110b are respectively directly electrically connected to the electrically conductive probes 104a and 104b, meaning that the conductors 110a and 110b are respectively directly electrically connected to the conductive bumps 45 and 46 on the integrated circuit die 40 when the manipulator tip 102 is in contact with the integrated circuit die 40.

A test board 118 is coupled to the conductors 110a and 110b. A machine interface 119 cooperates with the test board 118 to perform an electrical continuity test (crack test), as explained above, between the conductive bumps 45 and 46 via the conductors 110a and 110b and electrically conductive probes 104a and 104b.

Figure 4:
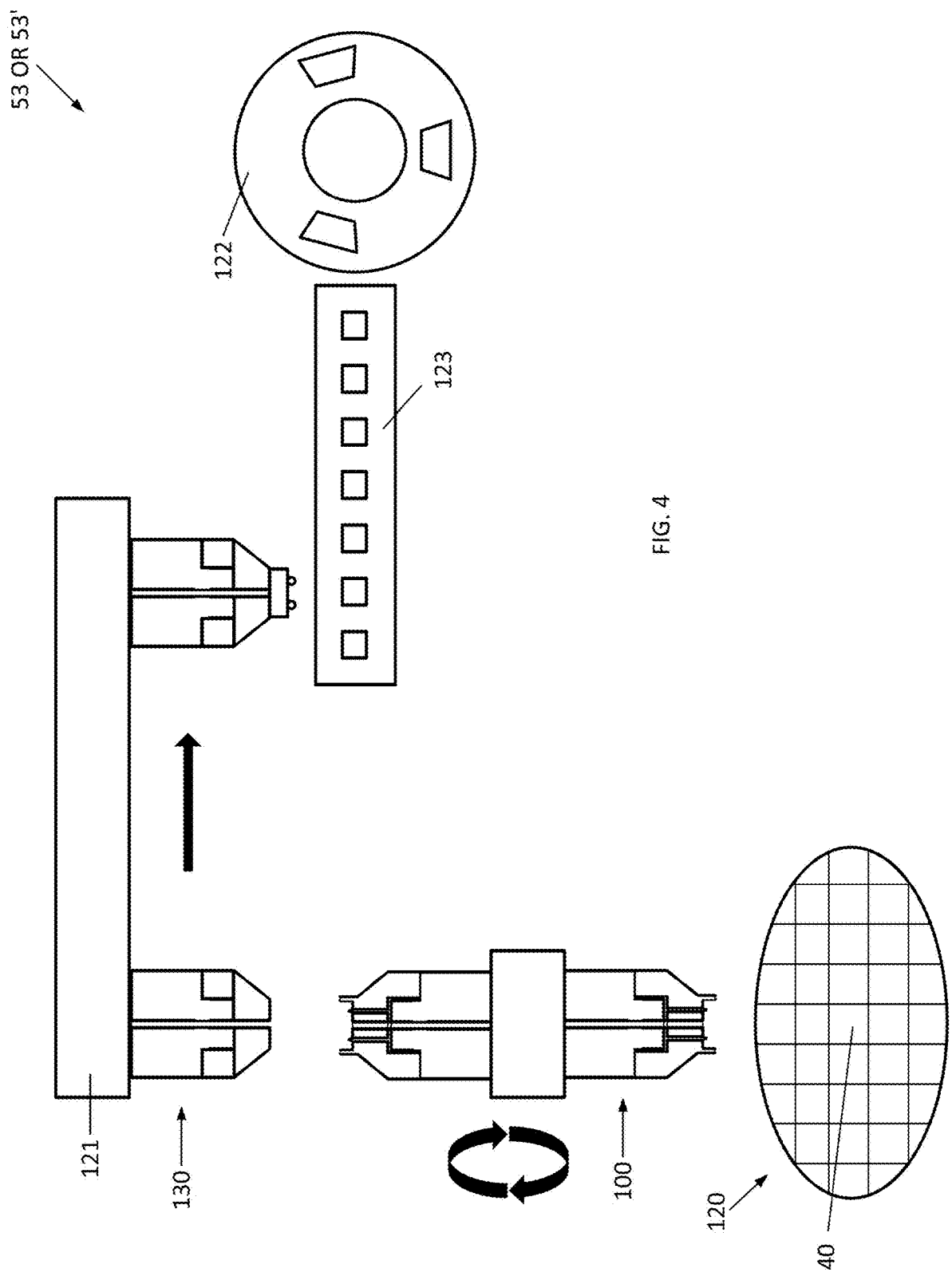
FIG. 4 is a diagrammatical view illustrating the process flow of the assembly portion of the flowcharts of FIGS. 2A-2B.

Referring additionally to FIG. 4 in combination with FIG. 2A, the techniques described herein focus on the assembly step 53. Note that in FIG. 4, the manipulator 100 (having the same structure as the manipulator arm 200 shown in FIG. 3) will be referred to as a "flipper", and that the manipulator 130 (which does not have a same structure as the manipulator 200 shown in FIG. 3) will be referred to as a "transfer arm".

Figure 1:
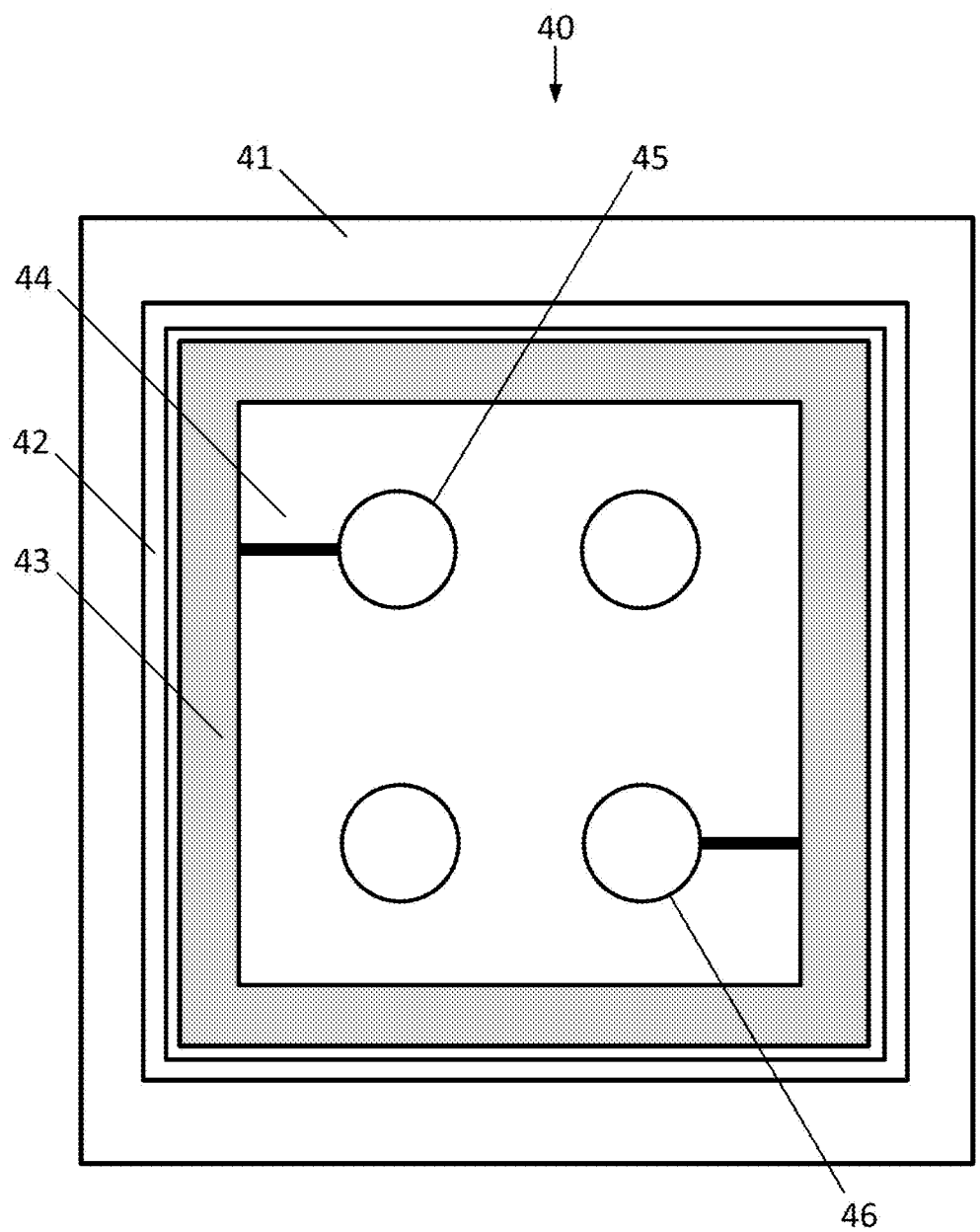
FIG. 1 is a block diagram of an integrated circuit die including an integrated circuit area bordered by a crack detector via chain, as known in the prior art.

The assembly step 53 first includes a die pickup and crack test process 53a. The die pickup and crack test process 53a includes first lowering the flipper tip 102 to contact an integrated circuit die 40 of the wafer 120, as shown in 53aa. Since the pogo pins 104a and 104b make physical and electrical contact with the conductive bumps 45 and 46 of the die (that are directly electrically connected to the crack tester 43 as shown in FIG. 1), the conductivity test (and thus crack test) between the conductive bumps 45 and 46 is then performed, as shown in 53bb. If the conductivity test indicates a low conductivity between the conductive bumps 45 and 46 (and thus, failure of the crack test and indication of a crack that has propagated through the periphery 41, through the die seal ring 42, and into the integrated circuit region 44) at 53cc, then the flipper tip 102 does not apply suction to pick up the integrated circuit die 40 (or releases suction if suction had been applied), and the flipper 100 is moved to a next adjacent die, as shown in 53ee, and the process returns to 53aa and is performed again until an integrated circuit die which passes the crack test is found. It is pointed out that the location of the failed integrated circuit die is marked or recorded so that the flipper 100 does not attempt to engage with the failed integrated circuit die 40 again.

If the conductivity test indicates a high conductivity between the conductive bumps 45 and 46 (and thus, a pass of the crack test and indication that a crack has not formed at all, or if it has formed, has not propagated through the die seal ring 42 into the integrated circuit area 44), then the flipper 100 applies suction to pick up the integrated circuit die 40, and "flips" the integrated circuit die 40, at 53dd. Flipping the integrated circuit die 40 is performed picking up the integrated circuit die 40 and rotating the flipper 100, such as by 180 degrees as shown in FIG. 4, so that the side of the integrated circuit die 40 that was facing the wafer 120 faces the transfer arm 130.

Next, while the flipper 100 maintains suction to keep the integrated circuit die 40 attached thereto, the transfer arm 130 makes contact with the integrated circuit die 40 and applies suction. Once the transfer arm 130 has applied suction to the integrated circuit die 40 to attach the integrated circuit die 40 thereto, the flipper 100 releases suction, thereby transferring the holding of the integrated circuit die 40 to the transfer arm 130, referred to as die handover, at 53b.

Thereafter, the integrated circuit die 40 is placed into a package 123, at 53c, and then tape sealed, at 53d. If the package 123 is attached to a length of material attached to a reel, the reel is then wound at 53e, producing a reel of completed integrated circuit die, at 53e. Final testing may optionally be performed at 54 by the end customer, ending the back end manufacturing. In some cases, the final testing may be performed prior to reel winding or tape sealing.

Performing the crack test during die pickup through having the flipper 100 serve dual duty as both flipper and tester not only has no effect on production time (unit production per hour), but helps to increase production yield (ratio of good die to bad die). If crack testing were not performed again after front end manufacturing, some integrated circuit die that had formed cracks (after front end manufacturing) that impacted their operation could end up packaged, with the result being that incorrectly operating integrated circuit die could end up utilized for production in electronic devices, producing faulty devices.

Figure 2B:
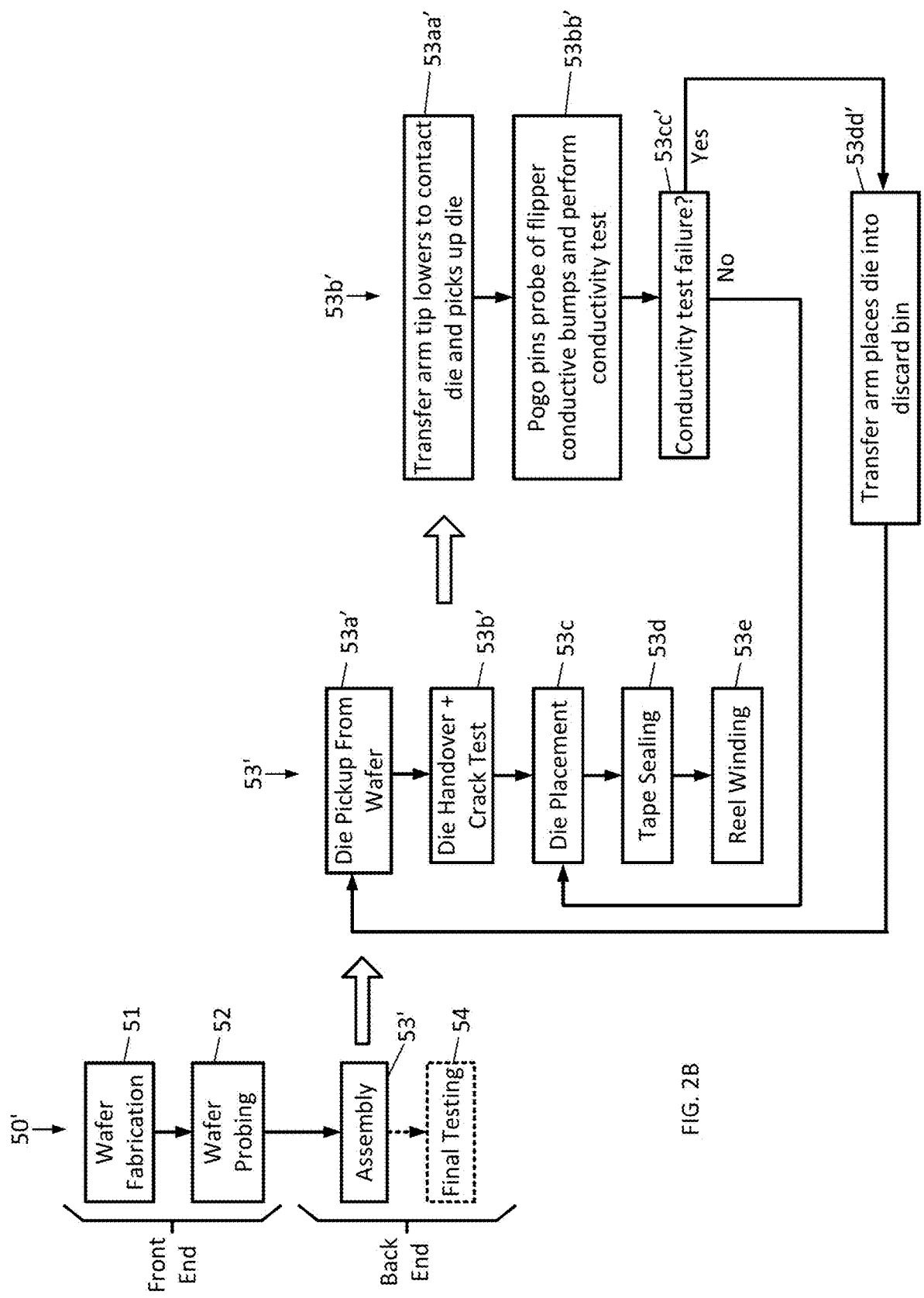
FIG. 2B is a flowchart of a second method for producing integrated circuit die, including crack detection, in accordance with this disclosure.

It should be appreciated that instead of the flipper 100 performing the crack testing prior to die handover, the flipper 100 may perform the crack testing during die handover. A flowchart 50' showing this embodiment is now described with additional reference to FIG. 2B.

Here, the front end manufacturing need not be described, as it proceeds as described above with reference to FIG. 2A. The assembly step 53' is different than in FIG. 2A, and will be described. The flipper 100 picks up the integrated circuit die 40 from the wafer 120, at 53a', and then a crack test is performed together with die handover 53b'.

The die handover and crack test 53b' includes lowering the transfer arm tip 102 to contact the integrated circuit die 40 and applying suction to pick up the integrated circuit die 40, at 53aa'. Since the pogo pins 104a and 104b of the flipper 100 will be making physical and electrical contact with the conductive bumps 45 and 46 of the die (that are directly electrically connected to the crack tester 43 as shown in FIG. 1) during handover, the conductivity test (and thus crack test) between the conductive bumps 45 and 46 is then performed, as shown in 53bb'. Note that the conductivity test is performed once the transfer arm tip 102 makes contact with the backside of the integrated circuit die 40 and before the flipper 100 has released contact with the integrated circuit die 40. The transfer arm tip 102 may apply downward pressure to the integrated circuit die 40 to assist and help ensure that the pogo pins 104a and 104b of the flipper 100 make physical and electrical contact with the conductive bumps 45 and 46 of the die.

If the conductivity test indicates a low conductivity between the conductive bumps 45 and 46 (and thus, failure of the crack test and indication of a crack that has propagated through the periphery 41, through the die seal ring 42, and into the integrated circuit region 44) at 53cc', then the transfer arm 130 will transfer the integrated circuit die 40 to a discard bin, at 53dd'.

If the conductivity test indicates a high conductivity between the conductive bumps 45 and 46 (and thus, a pass of the crack test and indication that a crack has not formed at all, or if it has formed, has not propagated through the die seal ring 42 into the integrated circuit area 44), then the transfer arm 130 proceeds with die placement 53c as described above, and then tape sealing 53d, reel winding 53e, and (optional) final testing 54 are performed, as also described above.

Note that, if desired, the specialized manipulator arm 200 may not be used as the flipper 100, and instead, the second instance of crack testing may be performed by the transfer arm 130 placing the integrated circuit die 40 into a separate tester prior to die placement. While this does increase yield, it increases production time (decreased units produced per hour), results in additional handling steps, and requires the purchase and use of a separate tester.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of testing an integrated circuit die for presence of a crack, the method comprising:
   performing back end integrated circuit fabrication processes on a wafer having a plurality of integrated circuit die, the back end integrated circuit fabrication processes including an assembly process, the assembly process comprising steps of:
   a) lowering a tip of a first manipulator arm to contact a given integrated circuit die of the plurality of integrated circuit die of the wafer such that pogo pins extending from the tip make electrical contact with conductive areas on the given integrated circuit die so that the pogo pins are electrically connected to a crack detector on the given integrated circuit die;
   b) performing a conductivity test on the crack detector using the pogo pins;
   c) if the conductivity test indicates a lack of presence of a crack in the given integrated circuit die, picking up the given integrated circuit die using the first manipulator arm; and
   d) if the conductivity test indicates presence of a crack in the given integrated circuit die, raising the tip of the first manipulator arm without picking up the given integrated circuit die, moving the first manipulator arm to a next given integrated circuit die, and repeating steps a), b), c) and d) on the next given integrated circuit die.

2. The method of claim 1, further comprising, at step c), flipping the given integrated circuit die using the first manipulator arm such that a surface of the given integrated circuit die facing the wafer now faces a different direction, and transferring the given integrated circuit die to a tip of a second manipulator arm, after picking up the given integrated circuit die.

3. The method of claim 1, wherein the presence of the crack in the given integrated circuit die indicates that the crack extends from a periphery of the given integrated circuit die, through a die seal ring of the given integrated circuit die, and into an integrated circuit region of the given integrated circuit die.

4. The method of claim 1, wherein the assembly process further comprises steps of:
   e) placing the given integrated circuit die into a package;
   f) sealing the package; and
   g) storing the package.

5. The method of claim 1, further comprising performing front end integrated circuit fabrication processes to produce the wafer having the plurality of integrated circuit die, prior to performing the back end integrated circuit fabrication processes; and wherein performing the front end integrated circuit fabrication processes includes:
   fabricating the wafer to include the plurality of integrated circuit die;
   performing a wafer sort operation including testing of the plurality of integrated circuit die, the testing of the plurality of integrated circuit die including, for each of the plurality of integrated circuit die, performing a conductivity test of a crack detector of that integrated circuit chain using test apparatus to determine presence of a crack in that integrated circuit die extending from a periphery of that integrated circuit die, through a die seal ring of that integrated circuit die, and into an integrated circuit region of that integrated circuit die; and
   marking any of the plurality of integrated circuit die for which the conductivity test of the crack detector determines presence of a crack.

6. A method of testing an integrated circuit die for presence of a crack, the method comprising:
   performing back end integrated circuit fabrication processes on a wafer having a plurality of integrated circuit die, the back end integrated circuit fabrication processes including an assembly process, the assembly process comprising steps of:
   a) lowering a tip of a first manipulator arm to contact a given integrated circuit die of the plurality of integrated circuit die of the wafer such that pogo pins extending from the tip make electrical contact with conductive areas on the given integrated circuit die so that the pogo pins are electrically connected to a crack detector on the given integrated circuit die;
   b) performing a conductivity test on the crack detector using the pogo pins;
   c) if the conductivity test indicates a lack of presence of a crack in the given integrated circuit die, picking up the given integrated circuit die using the first manipulator arm; and
   d) flipping the given integrated circuit die using the first manipulator arm such that a surface of the given integrated circuit die facing the wafer now faces a different direction, and transferring the given integrated circuit die to a tip of a second manipulator arm, after picking up the given integrated circuit die.

7. The method of claim 6, wherein the assembly process further comprises steps of:
   e) placing the given integrated circuit die into a package;
   f) sealing the package; and
   g) storing the package.

8. The method of claim 6, further comprising performing front end integrated circuit fabrication processes to produce the wafer having the plurality of integrated circuit die; and wherein performing the front end integrated circuit fabrication processes includes:
   fabricating the wafer to include the plurality of integrated circuit die;
   performing a wafer sort operation including testing of the plurality of integrated circuit die, the testing of the plurality of integrated circuit die including, for each of the plurality of integrated circuit die, performing a conductivity test of a crack detector of that integrated circuit chain using test apparatus to determine presence of a crack in that integrated circuit die; and
   marking any of the plurality of integrated circuit die for which the conductivity test of the crack detector determines presence of a crack.

9. A method of testing an integrated circuit die for presence of a crack, the method comprising:
   performing back end integrated circuit fabrication processes on a wafer having a plurality of integrated circuit die, the back end integrated circuit fabrication processes including an assembly process, the assembly process comprising steps of:
a) lowering a tip of a first manipulator arm to contact a given integrated circuit die of the plurality of integrated circuit die of the wafer such that pogo pins extending from the tip make electrical contact with conductive areas on the given integrated circuit die so that the pogo pins are electrically connected to a crack detector on the given integrated circuit die;
b) performing a conductivity test on the crack detector using the pogo pins; and
c) if the conductivity test indicates presence of a crack in the given integrated circuit die, raising the tip of the first manipulator arm without picking up the given integrated circuit die, moving the first manipulator arm to a next given integrated circuit die, and repeating steps a), b), and c) on the next given integrated circuit die.

10. The method of claim 9, wherein the presence of the crack in the given integrated circuit die indicates that the crack extends from a periphery of the given integrated circuit die, through a die seal ring of the given integrated circuit die, and into an integrated circuit region of the given integrated circuit die.

* * * * *